United States Patent [19]

Mitani et al.

[11] Patent Number: 4,784,718

[45] Date of Patent: Nov. 15, 1988

[54] METHOD FOR MANUFACTURING SEMICONDUCTOR DEVICE

[75] Inventors: Tatsuro Mitani, Tokyo; Toshikazu Fukuda, Kawasaki, both of Japan

[73] Assignee: Kabushiki Kaisha Toshiba, Kawasaki, Japan

[21] Appl. No.: 16,770

[22] Filed: Feb. 19, 1987

[30] Foreign Application Priority Data

Feb. 27, 1986 [JP] Japan .................................. 61-42256

[51] Int. Cl.$^4$ .................... H01L 21/00; H01L 21/306; B44C 1/22; C03C 15/00

[52] U.S. Cl. ..................................... 156/643; 156/646; 156/653; 156/657; 156/659.1; 156/662; 357/41; 357/67; 357/71; 437/41; 437/58; 437/192; 437/197; 437/228; 437/238; 437/241

[58] Field of Search ............... 156/643, 646, 653, 656, 156/657, 659.1, 662; 437/41, 58-59, 61, 187, 192, 194, 197, 228, 238, 241, 245, 912; 357/41-44, 47, 65, 67, 71

[56] References Cited

U.S. PATENT DOCUMENTS

| | | | |
|---|---|---|---|
| 4,426,765 | 1/1984 | Shahriary et al. | 29/571 |
| 4,455,738 | 6/1984 | Houston et al. | 156/643 X |
| 4,532,004 | 7/1985 | Akiyama et al. | 156/653 |
| 4,546,540 | 10/1985 | Ueyanagi et al. | 437/41 X |
| 4,561,169 | 12/1985 | Miyazaki et al. | 437/41 X |
| 4,572,765 | 2/1986 | Berry | 156/643 |
| 4,700,455 | 10/1987 | Shimada et al. | 437/41 X |

FOREIGN PATENT DOCUMENTS 0034729 9/1981 European Pat. Off. .

OTHER PUBLICATIONS

Patent Abstracts of Japan, vol. 9, No. 178 (E-330) (1901), Jul. 23, 1985, Japanese Patent Application 60-50965 (Toshiba K.K.), Mar. 23, 1985.

Applied Physics Letter, vol. 40, No. 9, May 1, 1982, pp. 805-807, American Institute of Physica, New York, R. L. Chapman et al., "Transient Annealing of Selenium-Implanted Gallium Arsenide Using a Graphite Strip Heater".

IBM Technical Disclosure Bulletin, vol. 24, No. 7A, Dec. 1981, pp. 3432-3433, Armonk, N.Y., H. S. Bhatia et al., "High Performance Mesfet Structure".

Primary Examiner—William A. Powell
Attorney, Agent, or Firm—Finnegan, Henderson, Farabow, Garrett and Dunner

[57] ABSTRACT

Disclosed is a semiconductor device with its gate electrode and source/drain extraction electrodes being made of the same material on a GaAs substrate, and with its source/drain heavily doped regions, which are formed by doping Se in a lightly doped semiconductor layer on the GaAs substrate, self-aligned with both gate electrode and source/drain extraction electrodes.

7 Claims, 2 Drawing Sheets

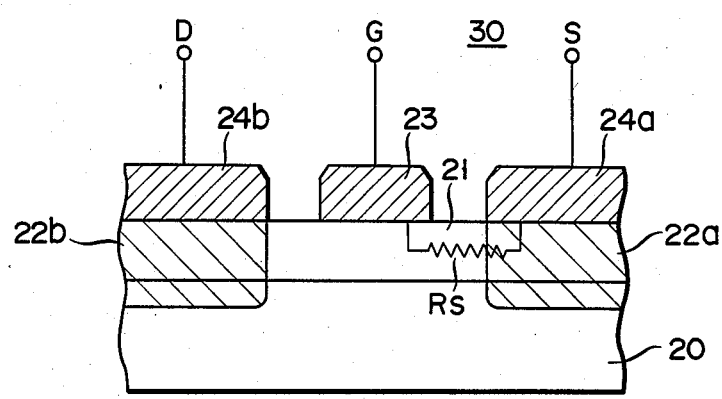
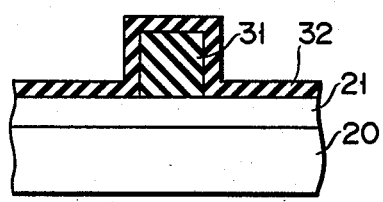
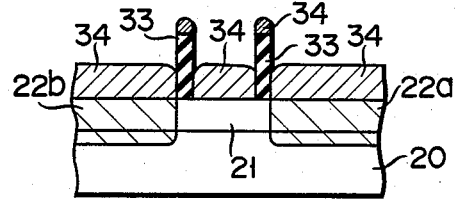
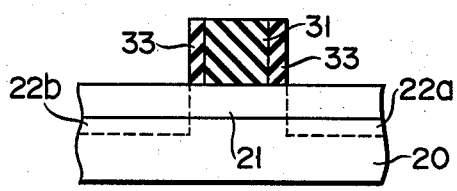
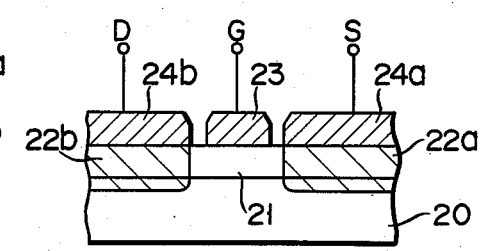
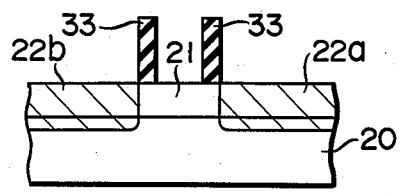

METHOD FOR MANUFACTURING SEMICONDUCTOR DEVICE

BACKGROUND OF THE INVENTION

This invention relates to a semiconductor device constituted by an ultra high frequency GaAs field effect transistor.

Previously known semiconductor devices including an ultra high frequency GaAs field effect transistor (hereinafter referred to as GaAs FET) have the device structure as shown in FIG. 1, for example. More specifically, a lightly doped semiconductor layer 2 of an N conduction type is formed on a semi-insulating undoped GaAs substrate 1 (hereinafter referred to as GaAs substrate). Heavily doped regions 3a and 3b constituting a source and drain, respectively are formed in the predetermined region of the lightly doped (low impurity concentration) layer 2 with a predetermined interval therebetween. A gate electrode 4 is formed on the lightly doped semiconductor layer 2 between the heavily doped regions 3a and 3b, and is made of metal such as Al, Au, etc. or is made of stacking metal layers such as Ti, Al. Source/drain extraction electrodes 5a and 5b of Au Ge/Pt, etc. are formed on the heavily doped regions 3a and 3b, respectively.

This conventional semiconductor device 10 is manufactured as follows.

First, as shown in FIG. 2A, the N conduction type lightly doped semiconductor layer 2 which acts as an active layer is selectively formed on the GaAs substrate 1. An $SiO_2$ film is formed on the lightly doped semiconductor layer 2, and the $SiO_2$ film thus formed is selectively etched to form a dummy gate 11 having a predetermined pattern. A side wall film constituting member 12 of a $Si_3N_4$ film is deposited so as to cover the dummy gate 11.

As shown in FIG. 2B, a resist film (not shown) is formed on the side wall constituting member 12. The resist film is etched-back to be flattened through a reactive ion etching technique (hereinafter referred to as RIE), thus removing the side wall film constituting member 12 portion on the dummy gate 11. Using, as a mask, the dummy gate 11 and the portion of the side wall film constituting member 12 at the side thereof, impurities of Si are ion-implanted in the lightly doped semiconductor layer 2 through the side wall film constituting member 12 portions on the lightly doped semiconductor layer 2. The implanted impurities are activated to form the heavily doped regions 3a and 3b.

As shown in FIG. 2C, the dummy gate 11 is removed through wet etching using $NH_4F$, for example.

As shown in FIG. 2D, an electrode constituting member 13 of metal such as Al, Au or stacking metal layers such as Ti, Al thereof is formed on the exposed surface of the lightly doped layer 2 using the remaining side wall film constituting member 12 as a mask.

As shown in FIG. 2E, both the side wall film constituting member 12 and the electrode constituting member 13 thereon are simultaneously removed through a chemical dry etching technique (CDE) so as to form a gate electrode 14 having a predetermined pattern on the lightly doped semiconductor layer 2.

Finally, as shown in FIG. 2F, an ohmic contact is patterned on the heavily doped regions 3a and 3b to form a resist pattern and an ohmic metal contact of AuGe/Pt, etc. is deposited by, e.g., evaporation, etc. After that, the source/drain extraction electrodes 5a and 5b are formed by means of a tape lift-off technique, thus completing the semiconductor device 10 by alloying the ohmic metal contact.

The conventional semiconductor device as shown in FIG. 1 has the following problems.

(1) The heavily doped regions 3a and 3b and the source/drain extraction electrodes 5a and 5b are not self-aligned with each other so that the interval between the gate electrode 4 and the extraction electrode 5a is larger than that between the gate electrode 4 and the heavily doped region 3a. This leads to insufficient reduction of a so-called source resistance Rs and large variations therein. As a result, the semiconductor device 10 cannot have a good high frequency performance.

(2) The intervals between the gate electrode 4 and the source/drain extraction electrodes 5a and 5b cannot be sufficiently reduced. Thus, the device cannot be sufficiently miniaturized and so its integration degree cannot also be sufficiently enhanced.

(3) The gate electrode 4 and the source/drain extraction electrodes 5a, 5b are made of different materials so that manufacturing process of the device is complicated.

(4) The ohmic property of the source/drain extraction electrodes is improved through the alloying of AuGe. However, if it is intended to further improve the ohmic property by increasing the concentration of Ge, a so-called ball-up phenomenon that the extraction electrodes 5a and 5b are peeled off will occur. If the extraction electrodes 5a and 5b are made of stacking metal layerssuch as AuGe, Pt, etc. as a holding member in order to prevent the aforesaid phenomenon, the electrode structure becomes complicated still more.

Further, the aforesaid method for manufacturing the semiconductor device, as shown in FIGS. 2A to 2F has the following problems.

(1) The heavily doped regions 3a and 3b, which act as a source and a drain, respectively, cannot have a sffficiently high impurity concentration and also the gate is in a Schottky gate structure so that in order to improve the ohmic property of the source/drain extraction electrodes 5a and 5b, the gate electrode 14 and the electrodes 5a, 5b must be made of different materials, thus making the manufacturing process complicated.

(2) The ohmic property of the source/drain extraction electrodes 5a and 5b can be improved by increasing the Ge concentration in the AuGe alloy constituting an ohmic metal contact. If the Ge concentration is increased, however, a so-called ball-up phenomenon that the extraction electrodes are peel off will occur. The provision of the extraction electrodes 5a and 5b in order to prevent such a phenomenon as a holding member of stacking metal layers such as Pt, Ni, Au, etc. makes the manufacturing process complicated.

(3) The heavily doped regions 3a and 3b are not self-aligned with the extraction electrodes 5a, 5b. This makes the so-called mask alignment process, etc. complicated and makes the completion of the miniaturized semiconductor device difficult.

(4) In order to improve the ohmic property of the source/drain extraction electrodes 5a and- 5b, the alloyed process of forming the ohmic metal contact of AuGe is required.

(5) The ohmic metal contact formed by the alloying process is liable to be influenced by physical and chemical conditions. Therefore, the selection of the kind of chemicals which are required for the succeeding treatment processes, and of time and temperature conditions in the processes is difficult.

SUMMARY OF THE INVENTION

An object of this invention is to provide a semiconductor device with its gate electrode and source/drain extraction electrodes made of the same material, and with its source/drain heavily doped regions self-aligned with both the gate electrode and source/drain extraction electrodes, thereby providing its excellent device performance and implementing its miniaturization.

Another object of this invention is to provide a method for manufacturing a semiconductor device, which is capable of providing its device performance and implementing its miniaturization.

In accordance with an aspect of this invention, there is provided a semiconductor device comprising a semiconductor substrate constituting a lightly doped semiconductor layer of one conduction type, a gate formed on a prescribed region on said lightly doped semiconductor layer, heavily doped regions which are self-alignedly formed in said lightly doped region with predetermined intervals from both sides of the gate electrode, and extraction electrodes of the same material as the gate which are formed in the heavily doped regions.

In accordance with another aspect of this invention, there is provided a method for a semiconductor device comprising the steps of forming a dummy gate on the prescribed region of a lightly doped semiconductor layer having one conduction type, said lightly doped layer being formed in a semiconductor substrate; forming, on the exposed surface of said lightly doped semiconductor layer, a side wall film constituting member covering the dummy gate; performing an anisotropic etching for the side wall film constituting member to form a side wall film on the side of said dummy gate and to expose the surface of said lightly doped semiconductor layer; introducing predetermined impurities into said lightly doped semiconductor layer using, as a mask, the side wall film and said dummy gate so as to form heavily doped regions; selectively removing said dummy gate; forming electrode constituting members on said exposed lightly doped semiconductor layer and said heavily doped regions using the remaining side wall film as a mask; and removing said side wall constituting member and the electrode constituting member deposited thereon so as to form predetermined electrodes on said heavily doped regions and said lightly doped semiconductor layer.

The semiconductor device in accordance with this invention provides the following meritorious effects.

(1) Since the heavily doped regions are self-aligned with both the gate electrode and the source/drain electrodes, the intervals between the gate electrode and the source/drain extraction electrodes can be sufficiently reduced, thereby implementing the miniaturization of the device and so the high integration degree thereof.

(2) Since the intervals between the gate electrode and the source/drain extraction electrodes are set to a constant and small value, the source resistance (Rs) can be reduced and its variations can be made small, thereby providing the improved high frequency characteristic of the device.

(3) Since the source/drain extraction electrodes are made of metal such as Al, Au, Ti/Al, etc. without through their alloying action, and also provide good ohmic contacts without holding members, the electrode structure can be simplified and also the manufacturing process can be simplified.

Further, the method for manufacturing a semiconductor device in accordance with this invention provides the following meritorious effects.

(1) Since the heavily doped regions are made so as to have a sufficiently high impurity concentration by the addition of Se, the source/drain extraction electrodes capable of providing good ohmic contacts can be easily made of metal such as Al, Au, Ti/Al, etc. without through their alloying action. Moreover, the gate eelectrode and the source/drain electrode can be simultaneously formed of the same material through a so-called dummy gate technique. Thus, the electrode forming step can be very simplified.

(2) Since the heavily doped regions, the gate electrode and the source/drain extraction electrodes can be formed using the same side wall film as a mask, the heavily doped regions can be self-aligned with both the gate electrode and the source/drain extraction electrode. Thus, the intervals between the gate electrode and the source/drain extraction electrode can be held at a small and constant value so that the source resistance and its variations can be reduced, thereby providing the improved high frequency characteristic of the device. The device can also be small-sized and miniaturized.

BRIEF DESCRIPTION OF THE DRAWINGS

FIG. 3 is a sectional view showing the schematic structure of a semiconductor device according to this invention;

FIG. 4A is a sectional view after the state when after a lightly doped layer had been formed on a GaAs substrate, an $SiO_2$ film has been formed on the lightly doped layer, the $SiO_2$ film has been selectively etched to form a dummy gate and a side wall film constituting member has been deposited;

FIG. 4B is a sectional view showing the state when the side wall film has been etched back to form a side wall film covering both sides of the dummy gate, and impurities have been ion-implanted in the lightly doped semiconductor layer and activated to form heavily doped regions;

FIG. 4C is a sectional view showing the state when the dummy gate has been removed;

FIG. 4D is a sectional view showing the state when an electrode constituting member has been deposited; and FIG. 4E is a sectional view showing the state when the side wall film and the electrode constituting member portion located thereon have been removed to form a gate electrode and source/drain electrodes.

DETAILED DESCRIPTION OF THE PREFERRED EMBODIMENT

Figure 1:
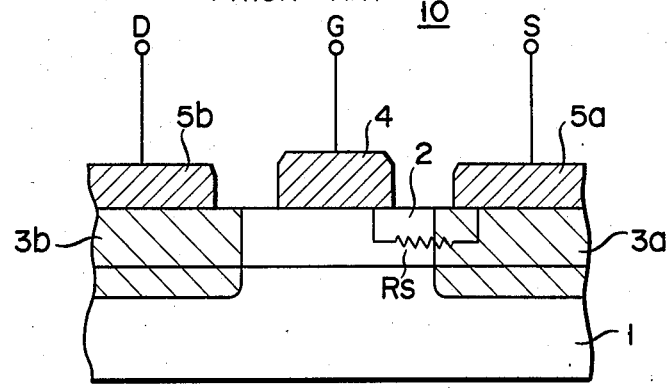
FIG. 1 is a sectional view showing the schematic structure of the prior art semiconductor device.
Figure 2A:
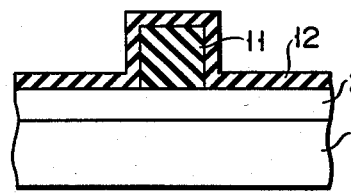
FIG. 2A to FIG. 2F are sectional views showing a metal for manufacturing the prior art semiconductor device.
Figure 2D:
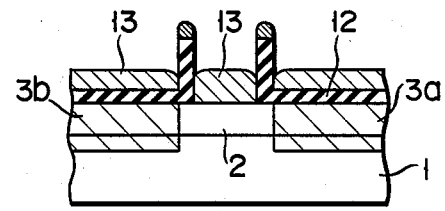
Figure 2B:
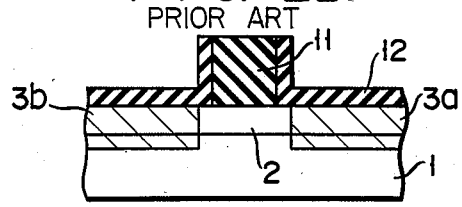
Figure 2E:
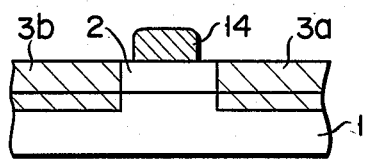
Figure 2C:
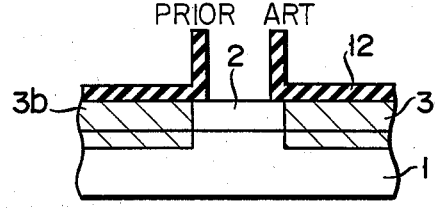
Figure 2F:
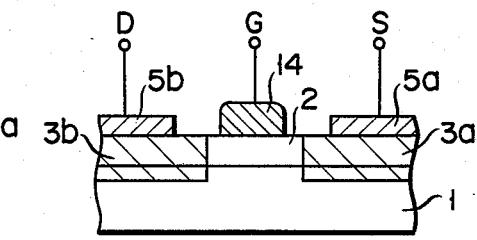

FIG. 3 is a sectional view showing the schematic structure of a semiconductor device according to this invention. In the figure, 20 is a semi-insulating undoped GaAs semiconductor substrate (hereinafter referred to as GaAs substrate). An N-conduction type lightly doped semiconductor layer 21 is deposited on the GaAs substrate 20. Heavily doped regions 22a and 22b which act as a source and a drain, respectively are formed in predetermined regions of the lightly doped semiconductor layer 21 by diffusing impurities of Se so that they extend into the GaAs substrate 20; the impurity concentration of those heavily doped regions 22a and 22b are set to 3 to $5 \times 10^{19}$ cm$^{-3}$. A gate electrode 23 is formed on the lightly doped semiconductor layer 21 located between the heavily doped regions 22a and 22b. Extraction electrodes 24a and 24b of the same material as the gate electrode are provided on the heavily doped regions 22a and 22b, respectively. The gate electrode 23 and the extraction electrodes 24a, 24b are made in a single layer structure of Al, Au, Ti/Al, etc. or a multi-layer structure of these metals. The heavily doped regions 22a and 22b are self-aligned with both the gate electrode 23 and the extraction electrodes 24a and 24b.

In the semiconductor device 30 constructed as mentioned above, the heavily doped regions 22a and 22b are self-aligned with both the gate electrode 23 and the extraction electrodes 24a and 24b so that the intervals between the gate electrode 23 and the extraction electrodes 24a, 24b are properly set to a predetermined value which is sufficiently small. Thus, the so-called source resistance (Rs) can be very reduced and its variations can also be made small, thereby providing the improved high frequency characteristic of the device.

Further, since the intervals between the gate electrode 23 and the extraction electrodes 24a, 24b can be reduced, the miniaturization of the device and the high integration degree thereof can be implemented. Since the gate electrode 23 and the extraction electrodes 24a and 24b are made of the same material, the electrode structure of the device can be simplified and the device performance can be improved.

A method for manufacturing a semiconductor device in accordance with this invention will be explained with reference to FIGS. 4A to 4E.

First, as shown in FIG. 4A, the N-conduction type lightly doped semiconductor layer 21 which acts as an active layer is formed on the GaAs substrate 20 through an ion implantation technique. An SiO$_2$ film is formed on the lightly doped semiconductor layer 21. The SiO$_2$ film thus formed is selectively etched to form a dummy gate 31 having a width of 0.25 to 0.5$\mu$ and a height of approx. 1$\mu$. A side wall film constituting member 32 of an Si$_3$N$_4$ film having a thickness of 0.5 to 1.0$\mu$, which covers the dummy gate 31, is deposited on the lightly doped semiconductor layer 21. The Si$_3$N$_4$ film may be a CVDSi$_3$N$_4$ film which is created by the reaction between SiCl$_4$, SiH$_4$, etc. and ammonia.

As shown in FIG. 4B, the side wall constituting member 32 is etched back through a RIE technique to form a side wall film covering both sides of the dummy gate 31 and expose the surface of the lightly doped semiconductor layer 21. Impurities of Se are hot-ion-implanted in the lightly doped semiconductor layer 21 using as a mask the dummy gate 31 and the side wall film 33; this ion-implantation is performed with a dose of $1 \times 10^{15}$ cm$^{-2}$ of Se and at a depth reaching the GaAs substrate. The implanted impurities of Se are activated by a lamp annealing technique, for example, to form the heavily doped regions 22a and 22b having an impurity concentration of 3 to $5 \times 10^{19}$ cm$^{-3}$.

As shown in FIG. 4C, the dummy gate 31 is removed through a wet etching technique using NH$_4$, etc.

As shown in FIG. 4D, an electrode constituting member 34 of Al, Au, or stacking metal layers such as Ti, Al is vacuum-deposited on the exposed surface of the lightly doped semiconductor layer 21 and the heavily doped regions 22a and 22b using the side wall film as a mask.

Finally, as shown in FIG. 4E, the side wall film 33 and the electrode constituting member 34 thereon are removed by the use of both a tape lift-off technique or ion-milling technique and a CDE technique, thus forming the gate electrode 23 and the source/drain extraction electrodes which have predetermined patterns. In this way, the semiconductor device 30 is completed.

In the process mentioned above, the intervals between the gate electrode 23 and the extraction electrodes 24a, 24b are decided in accordance with the thickness of the side wall film 31 and the heavily doped regions 22a and 22b are self-aligned with both the gate electrode 23 and the extraction electrodes 24a and 24b.

In accordance with the semiconductor device manufacturing method of this invention, the gate electrode 23 and the extraction electrodes 24a and 24b are made of the same material so that the device performance can be improved.

Further, the heavily doped regions 22a and 22b are formed by ion-implanting impurities of Se so that they are allowed to have a higher impurity concentration. Thus, the source/drain extraction electrodes 24a and 24b can make good ohmic contacts with the heavily doped regions 22a and 22b without through the alloying action. Further, in accordance with the method of this invention, there can be easily provided the semiconductor device 30 which has a very small and uniform source resistance (Rs) and is small-sized and highly integrated.

What is claimed is:

1. A method for manufacturing a semiconductor device comprising the steps of:
   forming a one-conduction type lightly doped semiconductor layer on a semiconductor substrate;
   forming a dummy gate on a predetermined region on said lightly doped semiconductor layer;
   forming a side wall film constituting member on the exposed surface of said lightly doped semiconductor layer, the side wall film constituting member covering said dummy gate;
   performing an anisotropic etching for said side wall film constituting member to form a side wall film on the side of said dummy gate and to expose the surface of said lightly doped semiconductor layer;
   introducing predetermined impurities into said lightly doped semiconductor layer, using as a mask said side wall film and said dummy gate, so as to form heavily doped regions;
   selectively removing said dummy gate so as to expose said lightly doped semiconductor layer therebelow;
   forming an electrode constituting member on said exposed lightly doped semiconductor layer and said heavily doped regions using the remaining side wall film as a mask; and
   removing said side wall film and said electrode constituting member deposited thereon so as to form predetermined electrodes on said heavily doped regions and said lightly doped semiconductor layer.

2. A method for manufacturing a semiconductor device according to claim 1, wherein said semiconductor substrate is made of GaAs.

3. A method for manufacturing a semiconductor device according to claim 2, wherein the concentration of impurities introduced in said heavily doped regions is $1 \times 10^{19}$ cm$^{-3}$ or more.

4. A method for manufacturing a semiconductor device according to claim 2, wherein said electrode constituting member is made in a single layer structure of Al, Au or Ti/Al or in a multi-layer structure consisting of these metals.

5. A method for manufacturing a semiconductor device according to claim 2, wherein said dummy gate is made of SiO$_2$.

6. A method for manufacturing a semiconductor device according to claim 2, wherein said side wall film constituting member is made of Si$_3$N$_4$.

7. A method for manufacturing a semiconductor device according to claim 2, wherein said anisotropic etching is a reactive etching.

* * * * *